United States Patent [19]

Andoh

[11] Patent Number: 5,311,156

[45] Date of Patent: May 10, 1994

[54] HIGH FREQUENCY DOUBLE POLE DOUBLE THROW SWITCH

[75] Inventor: Naoto Andoh, Itami, Japan

[73] Assignee: Mitsubishi Denki Kabushiki Kaisha, Tokyo, Japan

[21] Appl. No.: 980,172

[22] Filed: Nov. 23, 1992

[30] Foreign Application Priority Data

Apr. 22, 1992 [JP] Japan .................................. 4-130235

[51] Int. Cl.$^5$ .......................... H01P 1/10; H01P 5/12
[52] U.S. Cl. .................... 333/103; 257/390; 257/272; 333/262; 307/571
[58] Field of Search ................. 333/103, 104; 257/272, 257/368, 390; 307/242

[56] References Cited

U.S. PATENT DOCUMENTS

| | | | |
|---|---|---|---|
| 4,456,888 | 6/1984 | Ayasli | 330/277 |
| 4,939,485 | 7/1990 | Eisenberg | 333/104 |
| 5,006,816 | 4/1991 | Koide | 330/253 |
| 5,023,677 | 6/1991 | Truitt | 357/22 |

OTHER PUBLICATIONS

"Using GaAs MMICs as Control Devices" by Pengelly pp. 18-22 *MSN* Apr. 1989.
"Microwave Switching With GaAs FETs" by Ayasli *Microwave Journal* Nov. 1982.
"Multi Gate FET Power Switches" by F. McGrath et al. *Applied Microwave* Summer 1991.
Schindler et al, "A 2-18 GHz Non-Blocking Active 2×2 Switch", IEEE GaAs Symposium, 1989, pp. 181-183.

*Primary Examiner*—Robert J. Pascal
*Assistant Examiner*—Darius Gambino
*Attorney, Agent, or Firm*—Leydig, Voit & Mayer

[57] ABSTRACT

A DPDT switch includes first and second output signal electrodes opposite each other in an active region on a semiconductor substrate, a third output signal electrode opposite the second output signal electrode in the same active region, and first and second input signal electrodes disposed respectively between the first and second output signal electrodes and between the second and third output signal electrodes, and first control signal electrodes respectively disposed between the first input signal electrode and the first output signal electrode and between the second input signal electrode and the second output signal electrode for switching a signal between the input and output signal electrodes, and second control signal electrodes respectively disposed between the first input signal electrode and the second output signal electrode and between the second input signal electrode and the third output signal electrode for switching an input signal from the first and second input signal electrodes to the second and third output signal electrodes. The DPDT switch including an FET switch in the single active region enables a large reduction in the area of a switching circuit and miniaturization of the device to a large extent.

16 Claims, 7 Drawing Sheets

HIGH FREQUENCY DOUBLE POLE DOUBLE THROW SWITCH

FIELD OF THE INVENTION

The present invention relates to a high frequency double pole double throw (hereinafter referred to as DPDT) switch and, more particularly to a switch having a first and a second input terminal and a first and a second output terminal, receiving a first signal and a second signal at the first and the second input terminals, respectively, and outputs the first signal and the second signal from the first and the second output terminals, respectively, or from the second and the first output terminals, respectively.

BACKGROUND OF THE INVENTION

Figure 8:
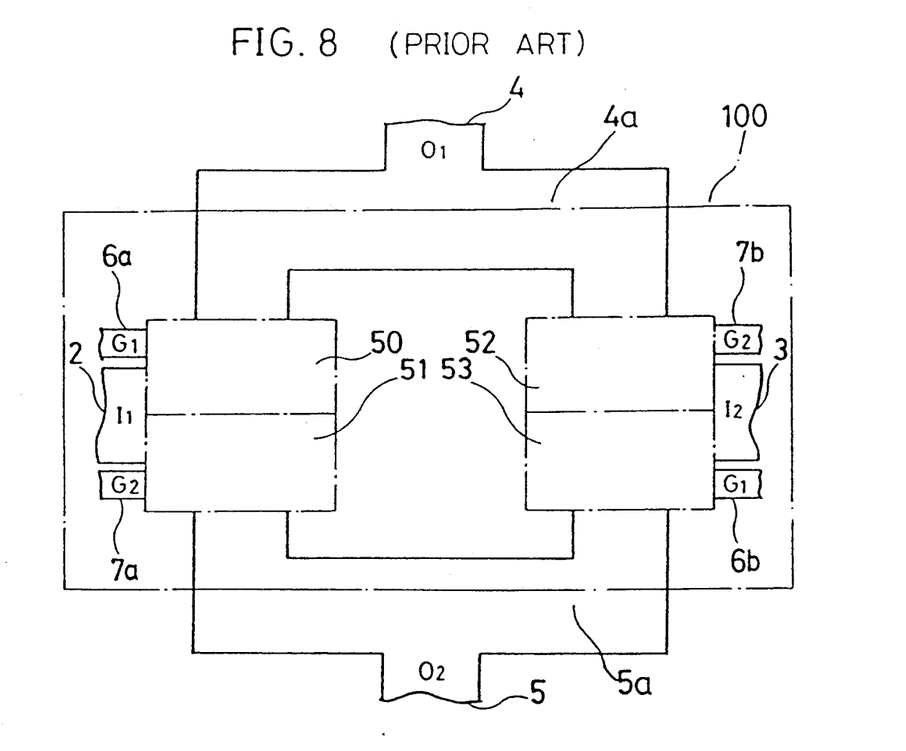
FIG. 8 is a block diagram showing the DPDT switch of a prior art.
Figure 9:
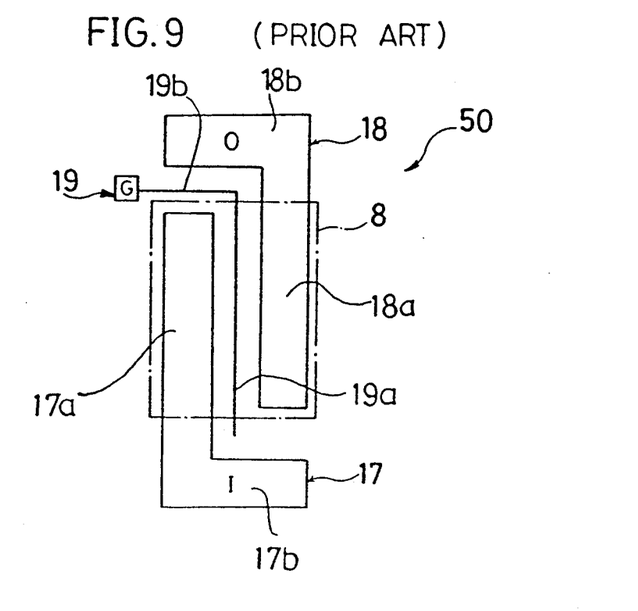
FIG. 9 is an enlarged view showing a switch part of a prior art DPDT switch.

FIG. 8 is a block diagram showing a prior art high frequency DPDT switch. FIG. 9 is an enlarged view showing detail of an FET part of the signal switch of FIG. 8.

In FIG. 8, reference numerals 2 and 3 designate a first input signal line $I_1$ and a second input signal line $I_2$ which are disposed to receive a first signal and a second signal input from the left and the right edge of the DPDT switch respectively. Numerals 4 and 5 designate a first output signal line $O_1$ and a second output signal line $O_2$ which are disposed to output either of the first and the second signals from the upper edge of the switch and the other of the first and the second signals from the lower edge of the switch, respectively, perpendicular to the input signal lines 2 and 3. A first FET 50 is arranged to output a signal from the first input signal line $I_1$ to the first output signal line $O_1$ or to cut off its output. A second FET 51 is arranged to output a signal from the first input signal line $I_1$ to the second output signal line $O_2$ or to cut off its output. A third FET 52 is arranged to output a signal from the second input signal line $I_2$ to the first output signal line $O_1$ or to cut off its output. A fourth FET 53 is arranged to output a signal from the second input signal line $I_2$ to the second output signal line $O_2$ or to cut off its output. Numerals 6a and 7a designate a first and a second control signal line $G_1$ and $G_2$, respectively, which are disposed in parallel with the input signal line 2 to control "on" or "off" switching of the first and the second FETs 50 and 51. Numerals 7b and 6b designate a second and a first control signal line $G_2$ and $G_1$, respectively, which are disposed in parallel with the input signal line 3 to control "on" or "off" switching of the third and the fourth FET switch 52 and 53. Numeral 100 designates a signal switch (high frequency DPD switch) comprising the above described elements.

In FIG. 9 showing details of an FET that is part of the signal switch, numeral 8 designates an active layer of the first FET 50 formed on a surface of a semiconductor substrate. An input electrode I 17 of the FET 50 comprises its main electrode part 17a formed on the active layer 8 and its line connecting part 17b formed integrally with the main electrode part 17a. An output electrode O 18 of the FET 50 comprises its main electrode part 18a formed on the active layer 8 and its line connecting part 18b formed integrally with the main electrode part 18a. A control electrode G 19 of the FET comprises its finger part 19a formed between the main electrode parts 17a and 18a of both electrodes on the active layer 8 and its lead part 19b formed extending from the finger part 19a.

Here, the detailed structures of the first to the fourth FETs 51 to 53 are all the same and when constituting the high frequency DPDT switch, the directions of arrangement of the FETs should be appropriately chosen to enable connections with the input and output lines.

A description is given of the operation.

In the FET switch of FIG. 9, when an ON voltage, for example, 0V is applied to the control electrode 19, a high frequency signal input to the input electrode 17 flows through the active layer 8 to the output electrode 18, resulting in the switch being is the "on" state. On the other hand, when an OFF voltage, for example, $-5V$ is applied to the control electrode 19, the input signal cannot flow to the output electrode 18 due to a depletion layer generated in the active layer 8, resulting in the switch being with "off" state. The signal switches 50 to 53 each comprising an FET operate to switch the high frequency signal, by utilizing these two states of the FET. The DPDT switch of FIG. 8 switches the high frequency signals between the two input signal lines $I_1$ and $I_2$ and the two output signal lines $O_1$ and $O_2$ by employing four FETs.

Now, in FIG. 8, the signal switch FETs 50 and 53, whose control electrodes 19 are connected with the first control line 6a and 6b, respectively, are connected between the first input signal line 2 and the first output signal line 4 and between the second input line 3 and the second output line 5, respectively. The signal switch FETs 51 and 52, whose control electrodes 19 are connected with the second control line 7a and 7b, respectively, are connected between the first input signal line 2 and the second output signal line 5 and between the second input signal line 3 and the first output signal line 4, respectively. When mutually complementary ON-/OFF voltages are applied to the first control signal line 6 and the second control signal line 7 respectively, the high frequency first and second input signals received at the first input signal line 2 and the second input signal line 3 are switched between a state where they are output to the first output signal line 4 and the second output signal line 5, respectively, and a state where they are output to the second output signal line 5 and the first output signal line 4, respectively, without interferring with each other in both states.

The above described operation makes it possible to receive the two input signals at the first input signal line 2 and the second input signal line 3 and output respective signals switched between the output paths of the first output signal, line 4 and the second output signal line 5, without interferring with each other.

In the prior art high frequency DPDT switch device constituted as described above, it is necessary to employ at least four FET switches. In addition, because the respective FET switches require input and output electrodes having a certain area in order to enable transmission and cutting off of respective signals, many input and output electrodes have to be disposed in the vicinity of the active layer of the respective FET switches, resulting in the DPDT switch unfavorably occupying a large area on a wafer. Further, it is required to provide output line connecting parts 4a and 5a for connecting the output lines of FET switches 50 and 52 and the output lines of FET switches 51 and 53, respectively, to constitute the output lines 4 and 5, respectively. Also, it is required to make the direction of arrangement of the input line and that of the output line of the DPDT switch perpendicular to each other in view of the structure of the FET switch.

SUMMARY OF THE INVENTION

It is an object of the present invention to provide a high frequency DPDT switch which receives two signals at two input signal lines, respectively, and outputs the signals switchingly from a first and a second, or from a second and a first output signal line, respectively, without interferring with each other, employing an FET element.

It is a further object of the present invention to provide a high frequency DPDT switch that can be miniaturized and has a large degree of freedom in its arrangement.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to an aspect of the present invention, in a high frequency DPDT switch, which receives input signals at first and second input signal lines, respectively, and outputs the signals either from first and second, or from second and first output signal lines, respectively, comprises a switching circuit, and the switching circuit comprises first and second output signal electrodes disposed opposite to each other in an active region on a semiconductor substrate, another output signal electrode disposed opposite to the second output signal electrode, and first and second input signal electrodes disposed between the first and the second output signal electrodes and between the second and the other output signal electrodes, respectively, and further first control signal electrodes disposed between the first input and the first output signal electrodes and between the second input and the second output signal electrodes, respectively, and second control signal electrodes disposed between the first input and the second output signal electrodes and between the second input and the other output signal electrodes, respectively.

According to a second aspect of the present invention, a high frequency DPDT switch comprises a switching circuit, and the switching circuit comprises second and first input signal electrodes disposed opposite to each other in an active region on a semiconductor substrate, another input signal electrode arranged opposite to the first input signal electrode, and a first and a second output signal electrodes disposed between the second and the first input signal electrodes and between the first and the other input signal electrodes, respectively, and further first control signal electrodes disposed between the first input and the first output signal electrodes and between the second input and the other output signal electrodes, respectively, and second control signal electrodes disposed between the second input and the first output signal electrodes and between the first input and the second output signal electrodes, respectively.

As a result, signal switching of two different input signals to one or the other of the two different output lines, or reversely thereto can be performed, without interferring with each other by means of one FET element. This enables miniaturization of the device and a reduction in the occupation area of the electrodes.

According to a third aspect of the present invention, a high frequency DPDT switch comprises a switching circuit, the switching circuit comprises N (where N is an integer equal to two or more) unit switching circuits each comprising a first output signal electrode, a first input signal electrode, a second output signal electrode, and a second input signal electrode being disposed in this order in an active region on a semiconductor substrate on a straight line connecting the centers of the four electrodes, being disposed serially o the straight line connecting the centers of the four electrodes, and another output signal electrode disposed outside the N-th unit switching circuit also on the straight line connecting the centers of the four electrodes, and further plural first control signal electrode respectively disposed between each of the plural first input signal electrodes and each of the plural first output signal electrodes and between each of the plural second input signal electrodes and each of the plural second output signal electrodes, and plural second control signal electrodes respectively disposed between each of the plural first input signal electrodes and each of the plural second output signal electrodes and between each of the plural second input signal electrodes and each of the plural first output signal electrodes or the other output signal electrode.

According to a fourth aspect of the present invention, a high frequency DPDT switch comprises a switching circuit, and the switching circuit comprises N (where N is an integer equal to two or more) unit switching circuits each comprising a second input signal electrode, a first output signal electrode, a first input signal electrode, and a second output signal electrode being disposed in this order in an active region on a semiconductor substrate on a straight line connecting the centers of the four electrodes, being disposed serially on the straight line connecting the centers of the four electrodes, and another input signal electrode disposed outside the N-th unit switching circuit also on the straight line connecting the centers of the four electrodes, and further plural first control signal electrodes respectively disposed between each of the plural first input signal electrodes and each of the plural first output signal electrodes and between each of the plural second input signal electrodes or the other input signal electrode and each of the plural second output signal electrodes, and plural second control signal electrodes respectively disposed between each of the plural first input signal electrodes and each of the plural second output signal electrodes and between each of the plural second input signal electrodes and each of the plural first output signal electrodes.

Since plural unit switching circuits are employed to perform signal switching in outputting respective two different input signals to one or the other of two different output signal lines or reversely thereto, without interferring with each other, a larger input signal can be switched by the whole switching circuit. Further, because plural switching circuits are provided, input and output constants for signals such as circuit impedances can be changed, resulting in an increase in the degree of freedom in designing the circuit.

Since plural FETs are disposed in an active layer, the area occupied by the whole switching circuit comprising the plural unit switching circuits can be miniaturized.

According to a fifth aspect of the present invention, in a high frequency DPDT switch comprising one or more switching circuits, any two electrodes among first and second input connecting electrodes and first and second output connecting electrodes are disposed sandwiching the switching circuit or in parallel with the switching circuit array, the two electrodes are connected with the respective corresponding signal electrodes in the switching circuit via air bridges, and the other two connecting electrodes are disposed at the upper and lower edges of the switching circuit array, respectively and are connected with corresponding signal electrodes in the switching circuit via air bridges, respectively. Either of the other two connecting electrodes may be substituted with the electrode in the switching circuit.

Since the direction of connection the input and output signal lines can be chosen arbitrarily, the degree of freedom in arrangement in circuit design is increased.

DETAILED DESCRIPTION OF THE PREFERRED EMBODIMENT

Embodiments of the present invention will be described in detail with reference to the drawings.

First Embodiment

Figure 1:
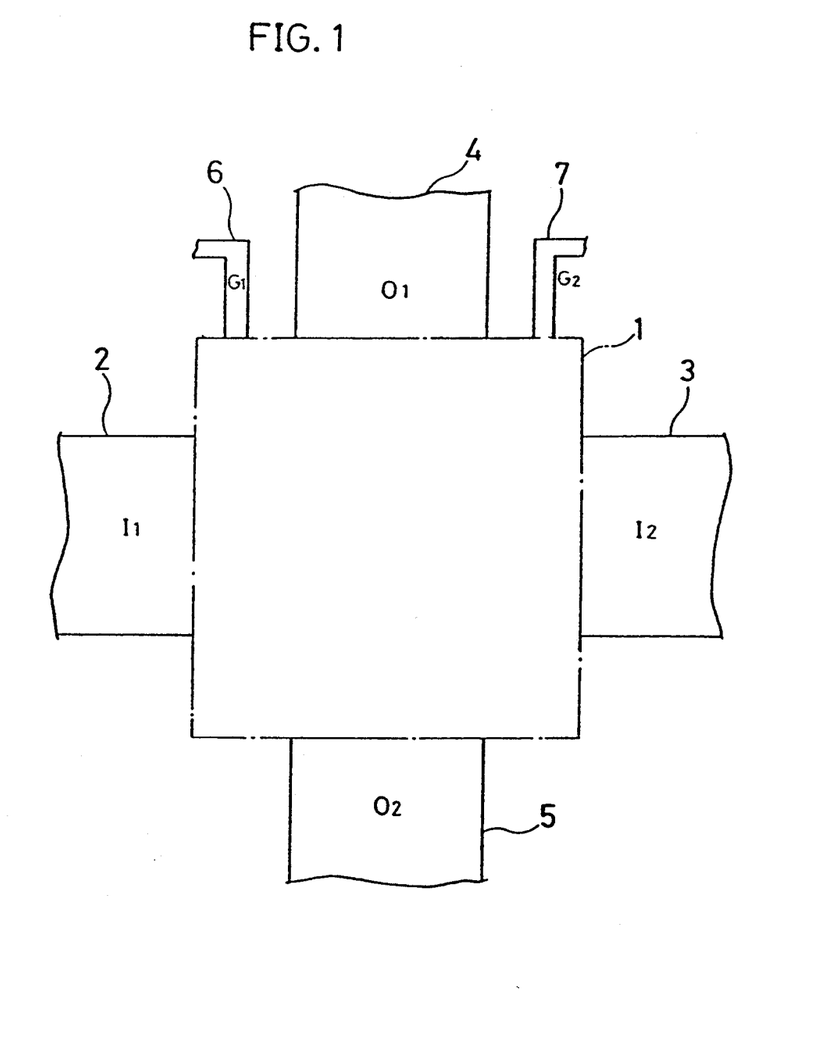
FIG. 1 is a block diagram showing a high frequency DPDT switch in accordance with a first embodiment of the present invention.
Figure 2:
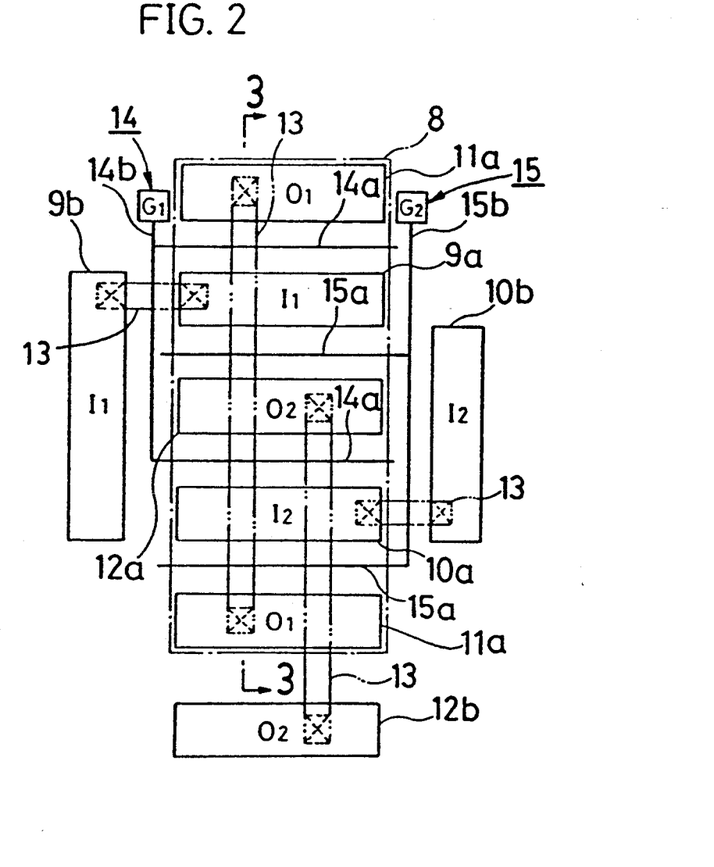
FIG. 2 is an enlarged view showing an FET switch part of the DPDT switch in accordance with the first embodiment of the present invention.
Figure 3:
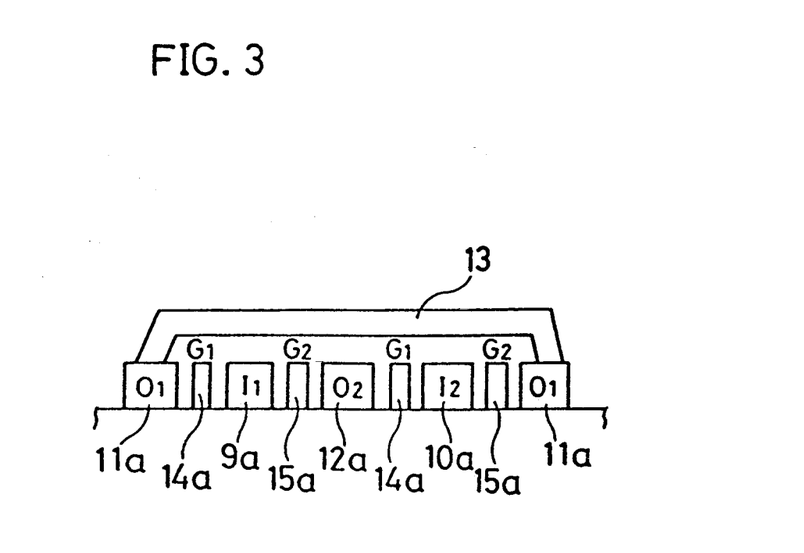
FIG. 3 is a typical sectional view at line 3—3 of the DPDT switch of FIG. 2.

FIG. 1 is a block diagram showing a semiconductor high frequency DPDT switch in accordance with a first embodiment of the present invention. This DPDT switch is of a type where a first input is arranged at the left edge of the device, a second input at the right edge, a first output at the upper edge and a second output at the lower edge. FIG. 2 shows the switch part thereof in detail. FIG. 3 is a sectional view along line 3—3 of FIG. 2.

In FIG. 1, the same reference numerals as those of FIG. 8 designate the same or corresponding parts. Numeral 1 designates a switch FET comprising a signal switch (switching circuit), which receives input signals at a first input signal line 2 and a second input signal line 3, respectively, and outputs the signals to either of a first output signal line 4 and a second output signal line 5 respectively or reversely thereto. In FIG. 2, numerals 11a designate one first output signal electrode and another first output signal electrode which are disposed opposite to each other in an active layer on a semiconductor substrate. Numeral 12a designates a second output signal electrode disposed between the two first output signal electrodes. Numeral 9a and 10a designate first and second input signal electrodes disposed between the first output signal electrode 11a and the second output signal electrode 12a, and between the second output signal electrode 12a and the other first output signal electrode 11a, respectively. Numerals 9b and 10b designate first and second input signal connecting electrodes which are disposed on the left edge and the right edge of the switch along the vertical direction, respectively, outside an active layer 8. These electrodes 9b and 10b transfer signals to the input signal electrodes 9a and 10a, respectively, and these are, respectively, connected with the first and the second input signal lines 2 and 3 of FIG. 1. Numeral 12b designates a second output signal connecting electrode which is disposed at the lower edge of the device outside the active layer 8 and this electrode 12b is provided so as to take out the signal from the second output signal electrode 12a. This electrode 12b is connected with the second output signal line 5 of FIG. 1. A first output signal is taken out directly from the first output signal electrode 11a which is disposed at the upper edge of the switch in the active layer 8, directly connected with the first output signal line 4 of FIG. 1. Corresponding electrodes 9a and 9b, 10a and 10b, and 12a and 12b are connected to each other, respectively via air bridges 13 and similarly the first output signal electrode 11a and the other first output signal electrode 11a are connected to each other via air bridge 13 as shown in FIG. 3.

Numeral 14a designates finger parts of first control signal electrodes which are disposed between the first input signal electrode 9a and the first output signal electrode 11a, and between the second input signal electrode 10a and the second output signal electrode 12a, respectively, and these are connected with a lead part 14b of the first control signal electrode 14. Numeral 15a designate finger parts of second control signal electrodes which are disposed between the first input signal electrode 9a and the second output signal electrode 12a, and between the second input signal electrode 10a and the first output signal electrode 11a, respectively, and these are connected with a lead part 15b of the second control signal electrode 15. The first and the second input signal electrode 9a and 10a and the first and second output signal electrodes 11a and 12a are 25 to 200 microns in length (horizontal direction in FIG. 2), 10 microns in width (longitudinal direction in FIG. 2), and 2 to 3 microns in thickness. Intervals between respective electrodes are 3 to 4 microns. Widths of the finger parts 14a and 15a of the control signal electrodes which are inserted between respective electrodes are 0.5 to 1 micron. The lead parts of the control signal electrodes are 2 to 3 microns in width and their thickness is 4000A. The air bridges are 5 microns in width and 2 to 3 microns in thickness. The operation frequency of the DPDT switch of this embodiment is in a range from about 500 MHz to about 20 GHz.

Next, a description is given of operation. First, when the signal to the first input signal line 2 is to be transferred to the first output signal line 4 and the signal to the second input signal line 3 is to be transferred to the second output signal line 5, respectively, a certain ON voltage (for example, 0V) is applied to the first control signal electrode 14a of the switch FET 1 through a first control signal line 6, thereby turning "on" the path between the first input signal electrode 9a and the first output signal electrode 11a and the path between the second input signal electrode 10a and the second output signal electrode 12a. At the same time, a certain OFF voltage (for example, −5V) is applied to the second control signal electrode 15a of the switch FET 1 through a second control signal line 7, thereby turning "off" the path between the first input signal electrode 9a and the second output signal electrode 12a and the path between the second input signal electrode 10a and the other first output signal electrode 11a. As a result, the signal received at the first input signal line 2 is output to the first output signal line 4 and the signal received at the second input signal line 3 is output to the second output signal line 5, respectively, without interferring with each other.

Secondly, when the signal to the first input signal line 2 is to be transferred to the second output signal line 5 and the signal to the second input signal line 3 is to be transferred to the first output signal line 4, respectively, a certain OFF voltage (for example, −5V) is applied to the first control signal electrode 14a of the switch FET 1 through the first control signal line 6, thereby turning "off" the path between the first input signal electrode 9a and the first output signal electrode 11a and the path between the second input signal electrode 10a and the second output signal electrode 12a. At the same time, a certain ON voltage (for example, 0V) is applied to the second control signal electrode 15a of the switch FET 1 through the second control signal line 7, thereby turning "on" the path between the first input signal electrode 9a and the second output signal electrode 12a and the path between the second input signal electrode 10a and the other first output signal electrode 11a. As a result, the signal received at the first input signal line 2 is output to the second output signal line 5 and the signal received at the second input signal line 3 is output to the first output signal line 4, respectively, without interferring with each other.

As described above, in the first embodiment of the present invention, in the single active layer 8 on the semiconductor substrate, there are provided the first, the second and the other first output signal electrodes 11a, 12a and 11a, opposite to each other, the first and second input signal electrode 9a and 10a alternatingly between the output electrodes, the first control signal electrodes 14a between the first input signal electrode and the upper first output signal electrode and between the second input signal electrode and the second output signal electrode respectively, and the second control signal electrodes 15a between the first input signal electrode and the second output signal electrode and between the second input signal electrode and the lower first output signal electrode, respectively. As a result, the single switch FET 1 formed in the single active layer, enables the signal switching operation of the DPDT switch which receives two different signals at two input signal terminals and outputs them switchingly to one or the other of the two different output signal lines, respectively, without interfering with each other, by complementary switching voltages applied to the first and the second control signal electrodes 14a and 15a, respectively. While in the prior art device eight input and output signal electrodes are required corresponding to four FETs for switching respective four paths between two inputs and two outputs, this embodiment only requires five electrodes, namely, the first input signal electrode 9a, the second input signal electrode 10a, two first output signal electrodes 11a, and the second output signal electrode 12a. This means that the area on the semiconductor substrate occupied by this signal switch, which is mainly occupied by the electrodes, can be reduced to about 5/8 to ½ of the prior art device and, resulting in miniaturization of the device.

Second Embodiment

While in the above described first embodiment the DPDT switch receives the first and the second input signals at the left and the right edges, respectively and outputs the first and the second output signals to the upper and the lower edges, respectively, a DPDT switch which receives the first and the second inputs at the upper and the lower edges, respectively and outputs the first and the second outputs to the left and the right edges, respectively can be produced by making all the directions of signal paths reverse to those of the above described first embodiment. This provides a second embodiment of the present invention.

Third Embodiment

Figure 4:
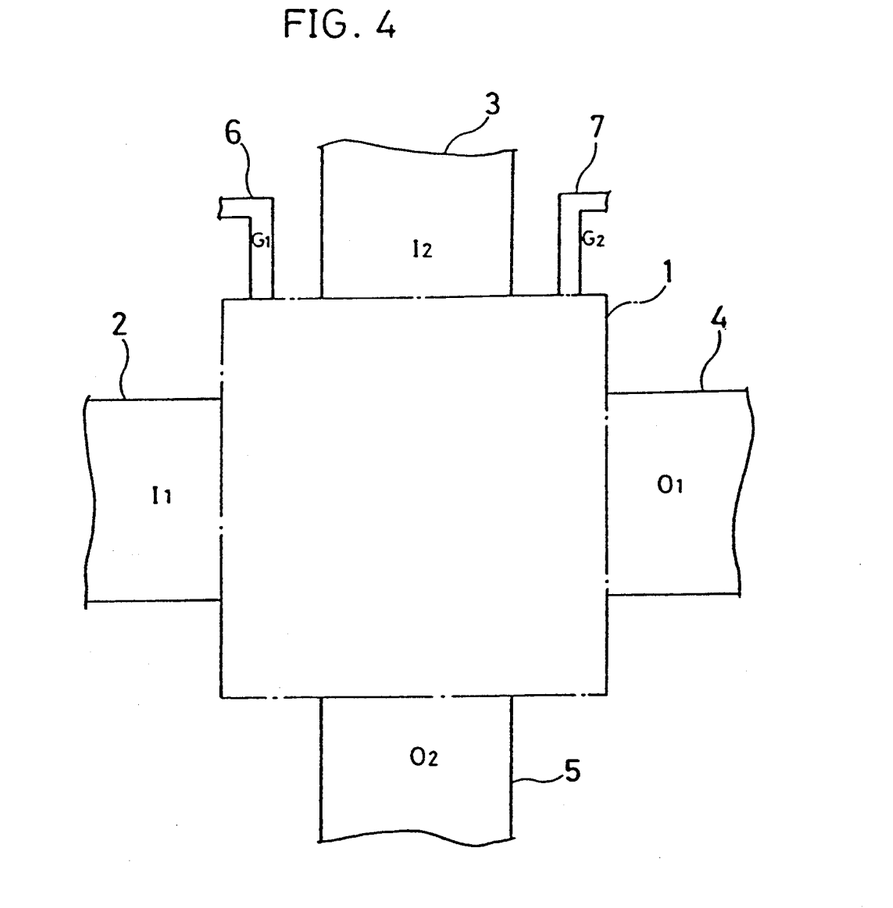
FIG. 4 is a block diagram showing a DPDT switch in accordance with a third embodiment of the present invention.
Figure 5:
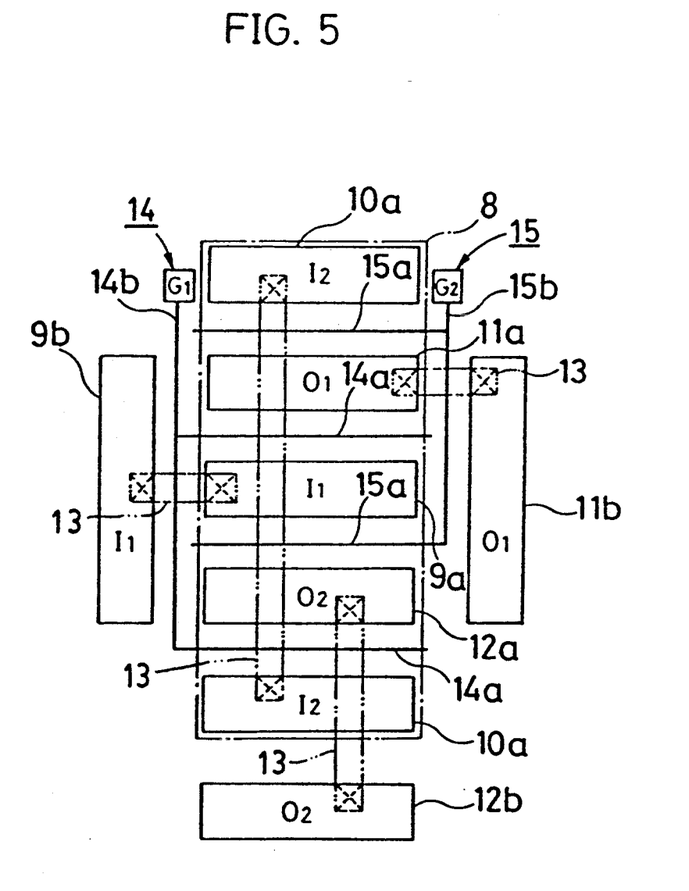
FIG. 5 is an enlarged view showing an FET switch part of the DPDT switch in accordance with the third embodiment of the present invention.

FIG. 4 is a block diagram showing a semiconductor DPDT switch in accordance with a third embodiment of the present invention, which comprises a DPDT switch of a type where a first input is disposed at the left edge, a second input at the upper edge, a first output at the right edge and a second output at the lower edge. FIG. 5 shows the switch part in detail. In the figures, the same reference numerals as those of the above described first embodiment designate the same or corresponding parts. In the first and second embodiments, the DPDT switch comprises first and the second inputs provided in the horizontal direction and the first and the second outputs provided in the vertical direction. On the contrary, in this third embodiment, the two inputs are perpendicular to each other and the two outputs are perpendicular to each other. In greater detail, the switch receives the first and the second input at the left and upper edges, respectively, and outputs the first and the second output to the right and lower edges, respectively. To enable such a disposition of the inputs and outputs, the signal electrodes are arranged in the active layer 8 in the order of the second input $I_2$, the first output $O_1$, the first input $I_1$, the second output $O_2$ and the second input $I_2$ from above, the active layer is sandwiched between the first input signal taking out electrode 9b on the left edge and the first output signal connecting electrode 11b on the right edge, the second output signal connecting electrode 12b is disposed on the lower edge on the straight line on which the above-described electrodes are disposed and the second input signal is received at the second input signal electrode $I_2$ on the upper edge on the straight line on which the above-described electrodes are disposed, while the electrodes in the active layer 8 are in the order of the first output $O_1$, the first input $I_1$, the second output $O_2$, the second input $I_2$ and the first output $O_1$ from above and the first output is taken out from the electrode $O_1$ on the upper edge in the first embodiment. Here, operation frequency of the DPDT switch of this embodiment is in a range from about 500 MHz to about 20 GHz similarly to the above described first embodiment.

Therefore, similar to in the first embodiment, the single switch FET 1 formed in the single active layer in this third embodiment enables the signal switching operation of the DPDT switch, in which two different signals are received at two input signal terminals and the two different signals are switchingly output to one or the other of two output signal terminals, respectively or reversely thereto, without interferring with each other, by complementary switching voltages applied to the first and the second control electrodes 14a and 15a. As a result, the area on the semiconductor substrate occupied by this signal switch, which is mainly occupied by the electrodes, can be reduced to about 5/8 to ½ of the prior art device area, resulting in miniaturization of the device.

Fourth Embodiment

While the DPDT switch receives the first and the second input at the left and the upper edge, respectively and outputs the first and the second output to the right and the lower edge, respectively in the above described third embodiment, a DPDT switch which receives the first and the second inputs at the right and lower edges, respectively and outputs the first and the second outputs to the left and upper edges, respectively can be made by making all the directions of signal paths reverse to those of the above described third embodiment. This provides a fourth embodiment of the present invention.

Fifth Embodiment

In the first to the fourth embodiments, the two input signals received at the two input signal lines are switchingly output to the two output signal lines by the single FET switch disposed in the single active region. Therefore, when high frequency signals with large amplitudes are input, a current flowing from the input signal electrode I to the output signal electrode O in the single FET unfavorably increases, causing the following problems. That is, even when the FET switch is in "off" state, if a certain large voltage is applied to the input electrode, short-circuiting occurs between the input and the output electrodes, resulting in a breakdown and a destruction of the element. Even when the FET switch is in "on" state, if an excessive input voltage is applied, the operation parts of the FET unfavorably generate heat and the FET is burnt thereby. In order to solve these problems, it is necessary to suppress the current flowing between the input signal electrode I and the output signal electrode 0 located adjacent to each other. To realize this, plural FETs may be connected with each other so as to suppress the current flowing between the respective input signal electrodes I and respective output signal electrodes O to a small value, thereby resulting in a reduction in burden to the respective FETs.

A description is given of a fifth embodiment employing the FET switch of the above described first embodiment as a unit switch, in plural, as a switching circuit as a whole.

Figure 6:
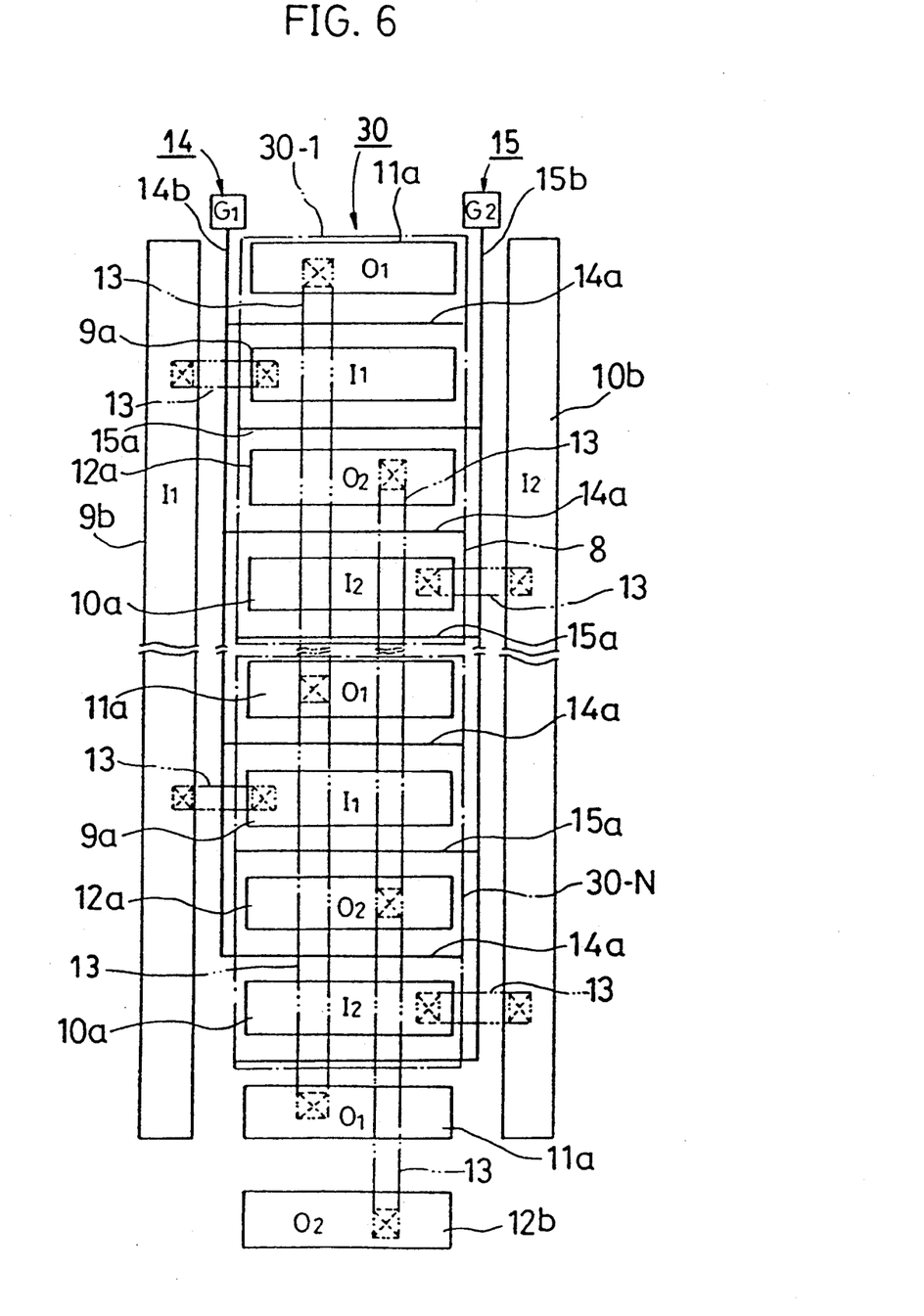
FIG. 6 is an enlarged view showing an FET switch part of a DPDT switch in accordance with a fifth embodiment of the present invention.

FIG. 6 shows a semiconductor DPDT switch in accordance with the fifth embodiment of the present invention, which comprises a DPDT switch of a type where a first input is arranged at the left edge, a second input at the right edge, a first output at the upper edge and a second output at the lower edge. The FET switch in accordance with the first embodiment includes a plurality of FETs in the single active layer 8.

A first output signal electrode 11a, a first input signal electrode 9a, a second output signal electrode 12a and a second input signal electrode 10a are disposed in this order, first control signal electrodes 14a are disposed between the first output signal electrode 11a and the first input signal electrode 9a and between the second output signal electrode 12a and the second input signal electrode 10a, and second control signal electrodes 15a are disposed between first input signal electrode 9a and the second output signal electrode 12a and below the second input signal electrode 10a, to provide a unit switch 30. N unit switches (where N is an integer equal to two or more) are arranged in the longitudinal direction in which direction the above respective electrodes are disposed in order. Further, another output signal electrode 11a is disposed below the N-th unit switch 30-N. First and the second input signal connecting electrodes 9b and 10b are provided extending in the direction of the unit switches, sandwiching the, unit, switches 30 therebetween, and the second output connecting electrode 12b is disposed outside the last one of the above described unit switches. In respective unit switches 30, the first input signal electrode 9a is connected with the first input signal connecting electrode 9b via air bridge 13 and the second input signal electrode 10a is connected with the second input signal connecting electrode 10b respectively via air bridge 13. Also, the plural first output signal electrodes 11a are mutually connected over the respective unit switches 30 via air bridge 13, and the second output signal electrodes 12a and the second output signal connecting electrode 12b are mutually connected over the respective unit switches 30 via air bridge 13. Here, operation frequency of the DPDT switch of this embodiment is in a range from about 500 MHz to about 20 GHz similarly to the above described first embodiment.

In this fifth embodiment, since a plurality of unit FET switches each comprising the above described four electrodes and additionally the other first output signal electrode are employed as a DPDT switch, the area occupied on the semiconductor substrate by the signal switch can be reduced to a large extent and a large input signal can be switched.

Namely, the FET comprising a pair of input signal electrodes I, a pair of output signal electrodes 0 and control signal electrodes G, functions, as a resistance in "on" state and as a capacitor in "off" state, respectively. When a large input current is applied to the FET in "on" state, the FET generates heat, and when it switches to the "off" state from "on" state, since a space between the input and the output electrodes serves as a capacitor at the moment when "on" state is turned into "off" state, the FET is not completely turned "off" with respect to AC and an effective cutting off is not exhibited. Here, the longer the length of the electrode, the larger the capacitance of the capacitor, resulting in a greater role as a capacitor. Of course, the significance of the role as a capacitor varies with frequency, and the "on" state preventing effect of the FET switch is larger when the frequency is lower. However, the load to the switch is large and the capacitor can not exhibit a sufficient cutting off effect when a large signal is applied, thereby resulting in likelihood of breakdown. In order to share this load evenly, the plural unit FET switches are connected with each other and this construction enables the load due to a current flow to be shared evenly and the loss occurring during the current flows reduced by making the regions where the current flows in the active layer as large as possible. Further, the number of resistors in "on" state and capacitors in "off"

state in the FET can be varied in accordance with the number of the unit FET switches employed and the input and output circuit constants for signals such as circuit impedances can be changed. As a result, the degree of freedom in designing a circuit can be enhanced. In addition, the occupation area of the device can be further reduced by evenly sharing the load.

Sixth Embodiment

While the DPDT switch of the above described fifth embodiment is one which receives the first and the second input at the left and right edges, respectively and outputs the first and the second output to the upper and lower edges, respectively, a DPDT switch which receives the first and the second inputs at the upper and lower edges, respectively, and outputs the first and the second output to the left and right edges, respectively can be made by making all the directions of signal paths reverse to those of th above described fifth embodiment. This provides a sixth embodiment of the present invention.

Seventh Embodiment

Figure 7:
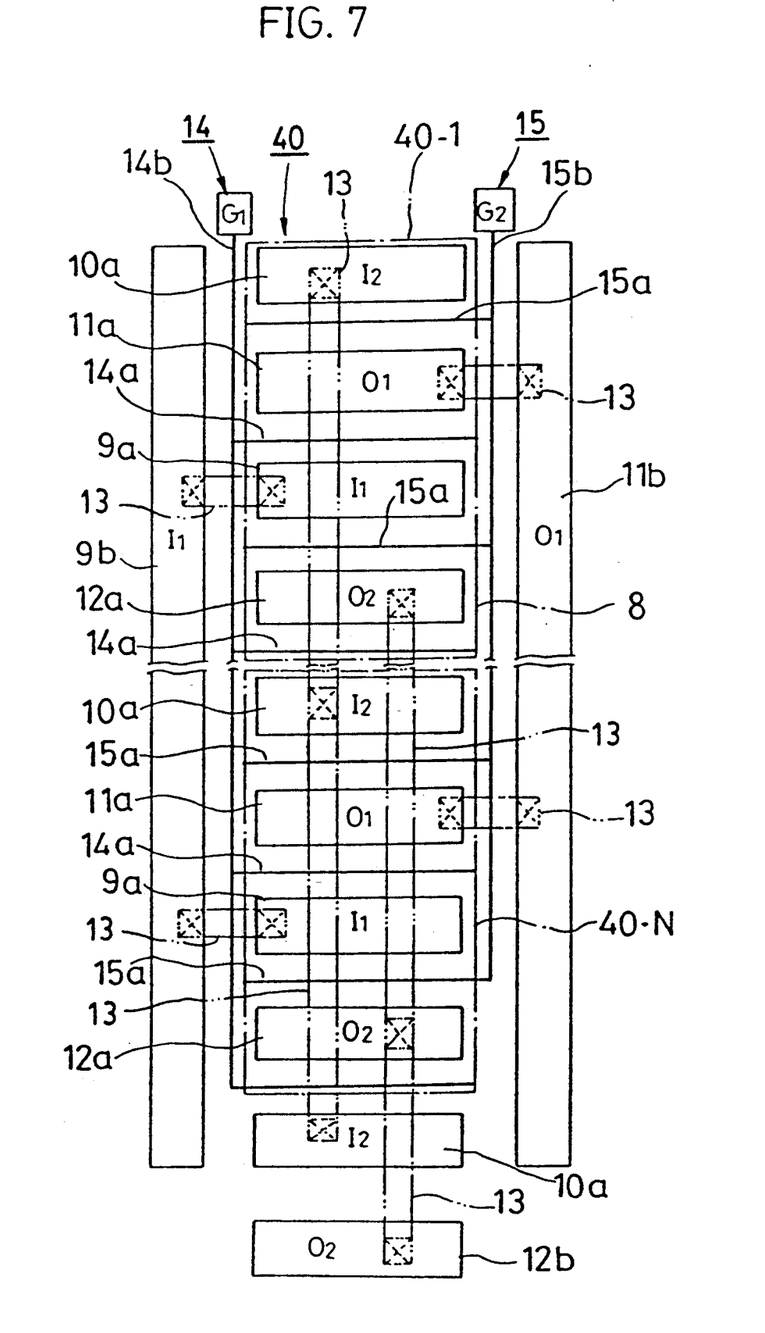
FIG. 7 is an enlarged view showing an FET switch part of a DPDT switch in accordance with a seventh embodiment of the present invention.

FIG. 7 shows a semiconductor device in accordance with a seventh embodiment of the present invention, which comprises a DPDT switch of a type where a first input is arranged at the left edge, a second input at the upper edge, a first output at the right edge and a second output at the lower edge. Th plural unit FET switches in accordance with the second embodiment are disposed in the single active layer 8, and the DPDT switch receives the first and the second input at the left and upper edges, respectively and outputs the first and second outputs to the right and lower edges, respectively can be made as described in the second embodiment. Thus, a large input signal can be handled as described in the above described fifth embodiment.

A second input signal electrode 10a, a first output signal electrode 11a, a first input signal electrode 9a and a second output signal electrode 12a are disposed in this order, and a second, a first and another second control signal electrodes 15a, 14a and 15a are disposed respectively between the four signal electrodes 10a, 11a, 9a and 12a in this order, and a first control signal electrode 14a is disposed below the second output signal electrode 12a similarly in the above-described second embodiment so as to provide a unit switch 40. N unit switches are arranged in the longitudinal direction in the figure. Further, another second input signal electrode 10a is disposed outside the switches, the first input signal connecting electrode 9b and the first output signal connecting electrode 11b are disposed extending in the disposition direction of the unit switches sandwiching the unit switches 40, and the second output signal connecting electrode 12b is disposed outside the last one of the above described unit switches. In respective unit switches 40, the first input signal electrode 9a is connected with the first input signal connecting electrode 9b via air bridge 13 and the first output signal electrode 11a is connected with the first output signal connecting electrode 11b via air bridge 13. Also, the plural first output signal electrodes 11a are mutually connected over the respective unit switches 40 via air bridge 13, and the second output signal electrodes 12a and the second output signal connecting electrode 12b are mutually connected over the respective unit switches 40 via an air bridge 13. Here, operation frequency of the DPDT switch of this embodiment is limited from about 500 MHz to about 20 GHz similarly to the above described second embodiment.

Since similarly in the fifth embodiment the plural unit FET switches each comprising the four electrodes and additionally the other second input signal electrode are employed as a DPDT switch also in this seventh embodiment, the area occupied on the semiconductor substrate by the signal switch can be reduced to a large extent and a large input signal can be switched. Further, the input and output circuit constant for signals such as circuit impedances and the degree of freedom in designing a circuit can be enhanced. In addition, the occupation area of the device can be further reduced by evenly sharing the load.

In addition, while in the above fifth and seventh embodiment cases where the FET switches in the single active layer are described, the active layer region may be divided for each unit FET switch. Further, the taking out direction of the respective control signal electrodes can be set arbitrarily. The respective signal electrodes can be employed also as the respective signal connecting electrodes, thereby enabling omission of the respective signal connecting electrodes.

As described above, according to the present invention, in a DPDT switch which receives input signals at a first and a second input signal line, respectively and outputs them switchingly from first and second output signal lines, or from second and first output signal lines, respectively first and second input signal electrodes are successively disposed in an active layer on a semiconductor substrate, first and second output signal electrodes are disposed between the input electrodes, and control electrodes which control "on" or "off" switching of the signal between the input and the output electrodes are disposed between the input signal electrodes and the output signal electrode located adjacent to each other, and another input or output signal electrode is added in any case where a unit switch comprising four input or output signal electrodes is provided either as a single unit or a plurality of units to enable construction of the switching circuit, and the respective signal electrodes and the corresponding input and the output signal connecting electrodes or the input and the output signal lines are mutually connected via air bridges and also the respective signal electrodes are mutually connected via air bridges. As a result, since the DPDT switch comprises an FET switch formed in the single active layer region, the area of a switching circuit occupied on the substrate is largely reduced and the device can be miniaturized.

Further, when plural unit switches are provided, sharing of the load so as to enable applying a large current as well as varying input and output circuit constants are enabled, thereby leading to enhancement of the degree of freedom in designing the circuit.

In addition, when plural unit switches are disposed in the single active layer, the area occupied by the whole switching circuit can be reduced.

Since the connecting direction of the input and the output signal lines can be arbitrarily set, the degree of freedom in the disposition in designing the circuit can be also enhanced.

What is claimed is:

1. A high frequency double pole double throw switch for receiving two different input signals at first and second input signal lines, respectively, and for switchingly outputting the two input signals from first and second output signal lines or from second and first output signal lines, respectively, comprising:

a semiconductor substrate including an active region;

first and second output signal electrodes disposed opposite each other in said active region and connected respectively to first and second output signal lines;

a third output signal electrode disposed opposite the second output signal electrode so that the second output signal electrode is disposed between the first and third output signal electrodes in the active region and connected to at least one of the first output signal line and the first output signal electrode;

first and second input signal electrodes disposed respectively between the first output signal electrode and the second output signal electrode and between the second output signal electrode and the third output signal electrode and connected respectively to first and second input signal lines;

a first control signal electrode disposed between the first input signal electrode and the first output signal electrode and between the second input signal electrode and the second output signal electrode for switching input signals from the first and second input signal electrodes to the first and second output signal electrodes; and a second control signal electrode disposed between the first input signal electrode and the second output signal electrode and between the second input signal electrode and the third output signal electrode for switching input signals from the first and second input signal electrodes to the second and third output signal electrodes.

2. The high frequency double pole double throw switch of claim 1 comprising:

first and second input signal connecting electrodes parallel to each other and disposed on opposite sides of the switching circuit with said first and second input signal electrodes and said first, second, and third output signal electrodes therebetween and a second output signal connecting electrode disposed at another side of the switching circuit; and a first air bridge connecting the first input electrode with the first input signal connecting electrode, a second air bridge connecting the second input signal electrode with the second input signal connecting electrode, a third air bridge connecting the second output signal electrode with the second output signal connecting electrode, and a fourth air bridge connecting the first output signal electrode in the active region with the third output signal electrode, said first and second input signal connecting electrodes being connected respectively with the first and second input signal lines, said second output signal connecting electrode being connected with the second output signal line, and said first output signal electrode being connected directly with the first output signal line.

3. The high frequency double pole double throw switch of claim 1 wherein all the inputs are replaced by all the outputs and all the outputs are replaced by all the inputs.

4. The high frequency double pole double throw switch of claim 2 wherein all the inputs are replaced by all the outputs and all the outputs are replaced by all the inputs.

5. A high frequency double pole double throw switch for receiving two different input signals at first and second input signal lines, respectively, and for switchingly outputting the two input signals from first and second output signal lines or from second and first output signal lines, respectively, comprising:

a semiconductor substrate including an active region;

first and second output signal electrodes disposed opposite each other in said active region and connected respectively to second and first output signal lines;

a third output signal electrode disposed opposite the first input signal electrode so that the first input signal electrode is disposed between the second and third input signal electrodes in the active region and connected to at least one of the second input signal line and the second input signal electrode;

first and second input signal electrodes disposed respectively between the second input signal electrode and the first input signal electrode and between the second output signal electrode and the third input signal electrode and connected respectively with first and second output signal lines;

a first control signal electrode disposed between the first input signal electrode and the first output signal electrode and between the second input signal electrode and the third input signal electrode for switching input signals from the first and second input signal electrodes to the first and second output signal electrodes; and a second control signal electrode disposed between the second input signal electrode and the first output signal electrode and between the first input signal electrode and the second output signal electrode for switching input signals from the first, second and third input signal electrodes to the first and second output signal electrodes.

6. The high frequency double pole double throw switch of claim 5 comprising:

first input and second output signal connecting electrodes parallel to each other and disposed on opposite sides of the switching circuit with said first, second, and third input signal electrodes and said first and second output signal electrodes therebetween and a second output signal connecting electrode disposed at another side of the switching circuit; and a first air bridge connecting the first input electrode with the first input signal connecting electrode, a second air bridge connecting the first output signal electrode with the first output signal connecting electrode, a third air bridge connecting the second output signal electrode with the second output signal connecting electrode, and a fourth air bridge connecting the second output signal electrode in the active region with the third input signal electrode, said first input and first output signal connecting electrodes being connected respectively with the first input and first output signal lines, said second output signal connecting electrode being connected with the second output signal line, and said first output signal electrode being connected directly with the second input signal line.

7. The high frequency double pole double throw switch of claim 5 wherein all the inputs are replaced by all the outputs and all the outputs are replaced by all the inputs.

8. The high frequency double pole double throw switch of claim 6 wherein all the inputs are replaced by all the outputs and all the outputs are replaced by all the inputs.

9. A high frequency double pole double throw switch for receiving two different input signals at first and second input signal lines, respectively, and for switchingly outputting the two input signals from first and second output signal lines or from second and first output signal lines, respectively, comprising:

a semiconductor substrate including N active regions;

N unit switching circuits (where N is an integer equal to at least two, each unit switching circuit comprising a first output signal electrode connected to a first output signal line, a first input signal electrode connected to a first input signal line, a second output signal electrode connected to a second output signal line, and a second input signal electrode connected to a second input signal line disposed in one of said active regions along a straight line perpendicular to the first output, first input, second output, and second input signal electrodes and a third output signal electrode disposed outside the N-th unit switching circuit;

plural first control signal electrodes disposed respectively between a first input signal electrode and a first output signal electrode and between a second input signal electrode and a second output signal electrode for switching signals between the input and output signal electrodes; and plural second control signal electrodes disposed respectively between a first input signal electrode and a second output signal electrode and between a second input signal electrode and a first output signal electrode for switching signals between the input and output signal electrodes.

10. The high frequency double pole double throw switch of claim 9 comprising:

first and second input signal connecting electrodes disposed parallel to each other and on opposite sides of the switching circuit with the plural input and output signal electrodes therebetween and a second output signal connecting electrode disposed at another side of the switching circuit; and a first air bridge connecting the plural first input electrodes to the first input signal connecting electrode, a second air bridge connecting the plural second input signal electrodes to the second input signal connecting electrode, a third air bridge connecting the plural second output signal electrodes to the second output signal connecting electrode, and a fourth air bridge connecting the plural first output signal electrodes in the active regions to the third output signal electrode, said first and second input signal connecting electrodes being connected respectively with the first and second input signal lines, said second output signal connecting electrode being connected with the second output signal line, and said first output signal electrode in an active region being connected directly with the first output signal line.

11. The high frequency double pole double throw switch of claim 9 wherein all the inputs are replaced by all the outputs and all the outputs are replaced by all the inputs.

12. The high frequency double pole double throw switch of claims 10 wherein all the inputs are replaced by all the outputs and all the outputs are replaced by all the inputs.

13. A high frequency double pole double throw switch for receiving two different input signals at first and second input signal lines, respectively, and for switchingly outputting the two input signals from first and second output signal lines or from second and first output signal lines, respectively, comprising:

a semiconductive substrate including N active regions;

N unit switching circuits (where N is an integer equal to at least two, each unit switching circuit comprising a second input signal electrode connected to a second input signal line, a first output signal electrode connected to a first output signal line, a first input signal electrode connected to a first input signal line, and a second output signal electrode connected to a second output signal line disposed in one of said active regions along a straight line perpendicular to the second input, first output, first input, and second output signal electrodes and a third input signal electrode outside the N-th unit switching circuit;

plural first control signal electrodes disposed respectively between a first input signal electrode and a first output signal electrode and between one of a second input signal electrode, a third input signal electrode, and a second output signal electrode for switching signals between the input and output signal electrodes; and plural second control signal electrodes disposed respectively between a first input signal electrode and a second output signal electrode and between a second input signal electrode and a first output signal electrode for switching signals between the input and output signal electrodes.

14. The high frequency double pole double throw switch of claim 13 comprising:

first input and first output signal connecting electrodes disposed parallel to each other and on opposite sides of the switching circuit with the plural input and output signal electrodes therebetween and a second output signal connecting electrode disposed at another side of the switching circuit; and a first air bridge connecting the plural first input electrodes to the first input signal connecting electrode, a second air bridge connecting the plural first output signal electrodes to the first output signal connecting electrode, a third air bridge connecting the plural second output signal electrodes to the second output signal connecting electrode, and a fourth air bridge connecting the plural second input signal electrodes in the active regions to the third input signal electrode, said first input and first output signal connecting electrodes being connected respectively with the first input and first output signal lines, said second output signal connecting electrode being connected with the second output signal line, and said second input signal electrode in an active region being connected directly with the second input signal line.

15. The high frequency double pole double throw switch of claim 13 wherein all the inputs are replaced by all the outputs and all the outputs are replaced by all the inputs.

16. The high frequency double pole double throw switch of claim 14 wherein all the inputs are replaced by all the outputs and all the outputs are replaced by all the inputs.

* * * * *

UNITED STATES PATENT AND TRADEMARK OFFICE
CERTIFICATE OF CORRECTION

PATENT NO. : 5,311,156
DATED : May 10, 1994
INVENTOR(S) : Naoto Andoh

It is certified that error appears in the above-indentified patent and that said Letters Patent is hereby corrected as shown below:

```
Column 14, line 8, change "output" to --input--;

line 10, change "output" to --input--;

line 12, change "output" to --input--;

line 19, change "input" to --output--;

line 37, insert --,-- after "second";

line 64, change "first output" to --second input--.

Column 15, line 13, insert --)-- after "two" and before ",".

Column 16, line 10, insert --)-- after "two" and before ",".
```

Signed and Sealed this

Twentieth Day of September, 1994

Attest:

BRUCE LEHMAN

Attesting Officer

Commissioner of Patents and Trademarks